US011056509B2

(12) United States Patent
Je et al.

(10) Patent No.: US 11,056,509 B2
(45) Date of Patent: Jul. 6, 2021

(54) DISPLAY DEVICE HAVING A PLURALITY OF THIN-FILM TRANSISTORS WITH DIFFERENT SEMICONDUCTORS

(71) Applicant: LG Display Co., Ltd., Seoul (KR)

(72) Inventors: Soyeon Je, Paju-si (KR); KiTae Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/529,424

(22) Filed: Aug. 1, 2019

(65) Prior Publication Data

US 2020/0168638 A1 May 28, 2020

(30) Foreign Application Priority Data

Nov. 22, 2018 (KR) .................. 10-2018-0145562

(51) Int. Cl.
| | |
|---|---|
| *H01L 29/08* | (2006.01) |
| *H01L 29/786* | (2006.01) |
| *H01L 31/0232* | (2014.01) |
| *H01L 51/40* | (2006.01) |
| *H01L 21/84* | (2006.01) |
| *H01L 27/12* | (2006.01) |
| *H01L 27/32* | (2006.01) |

(Continued)

(52) U.S. Cl.
CPC ...... *H01L 27/1225* (2013.01); *H01L 27/1218* (2013.01); *H01L 27/1237* (2013.01); *H01L 27/1255* (2013.01); *H01L 27/3258* (2013.01); *H01L 27/3276* (2013.01); *H01L 29/41733* (2013.01); *H01L 29/42384* (2013.01); *H01L 27/3262* (2013.01); *H01L 27/3265* (2013.01)

(58) Field of Classification Search
CPC ............. H01L 27/1225; H01L 27/1218; H01L 27/1237; H01L 27/1255; H01L 27/3262; H01L 27/3258; H01L 29/41733; H01L 29/42384; H01L 27/3276
See application file for complete search history.

(56) References Cited

U.S. PATENT DOCUMENTS

| 10,181,502 B2 * | 1/2019 | Oh ....................... H01L 27/1237 |
| 10,692,893 B2 * | 6/2020 | Lee ..................... H01L 27/1222 |

(Continued)

FOREIGN PATENT DOCUMENTS

KR    10-2018-0005580 A    1/2018

*Primary Examiner* — Alonzo Chambliss
(74) *Attorney, Agent, or Firm* — Fenwick & West LLP

(57) ABSTRACT

A display device includes a substrate; a buffer layer disposed on the substrate; a first thin-film transistor comprising a first active layer made of a low-temperature poly-silicon (LTPS), a first gate electrode overlapping with the first active layer with the first gate insulating layer and the second gate insulating layer therebetween, and a first source electrode and a first drain electrode electrically connected to the first active layer; and a second thin-film transistor comprising a second active layer made of an oxide semiconductor, a second gate electrode overlapping with the second active layer with the second gate insulating layer therebetween, and a second source electrode and a second drain electrode electrically connected to the second active layer. The first gate electrode of the first thin-film transistor and the second gate electrode of the second thin-film transistor may be disposed on the second gate insulating layer.

19 Claims, 2 Drawing Sheets

(51) Int. Cl.
    *H01L 29/417*        (2006.01)
    *H01L 29/423*        (2006.01)

(56)            References Cited

U.S. PATENT DOCUMENTS

2004/0075783 A1*  4/2004  Lee .................... G02F 1/13454
                                                          349/43
2004/0080481 A1*  4/2004  Yamazaki ............ G09G 3/3648
                                                          345/92
2015/0108438 A1*  4/2015  Kim .................... H01L 27/3258
                                                          257/40
2016/0063924 A1*  3/2016  Oh ...................... H01L 27/1225
                                                          345/690
2016/0172506 A1*  6/2016  Kim .................... H01L 27/1225
                                                          257/43
2019/0198534 A1*  6/2019  Je ........................ H01L 27/1222
2020/0144309 A1*  5/2020  Jeon ................... H01L 27/1225
2020/0168638 A1*  5/2020  Je ........................ H01L 27/1237

* cited by examiner

DISPLAY DEVICE HAVING A PLURALITY OF THIN-FILM TRANSISTORS WITH DIFFERENT SEMICONDUCTORS

CROSS-REFERENCE TO RELATED APPLICATIONS

This application claims the priority of Republic of Korea Patent Application No. 10-2018-0145562 filed on Nov. 22, 2018, in the Korean Intellectual Property Office, the disclosure of which is incorporated herein by reference in its entirety.

BACKGROUND

Technical Field

The present disclosure relates to a display device, and more particularly to a display device in which a plurality of thin-film transistors are made of different semiconductors respectively.

Description of the Related Art

As the era of information technology has begun, the field of display that represents electrical information signals graphically has been rapidly grown up. In accordance with this, various display devices which are thinner, lighter and lower power consumption have been developed.

Examples of such display devices include a liquid-crystal display (LCD) device, an organic light-emitting display (OLED) device, and an electroluminescence display device such as quantum-dot light-emitting display (QLED) device. Among these, an electroluminescence display device emerges as the next generation display device having a self-luminous characteristic since it exhibits good performance over LCD devices in terms of viewing angle, contrast ratio, response time, power consumption, etc.

An electroluminescence display device includes a display area for displaying an image, and a non-display area disposed adjacent to the display area. A pixel area includes a pixel circuit and alight-emitting element. A plurality of thin-film transistors is disposed in the pixel circuit to drive the light-emitting elements disposed in a plurality of pixels.

The thin-film transistors may be sorted by the material of the semiconductor layer. Among them, low-temperature poly-silicon (LTPS) thin-film transistors and oxide semiconductor thin-film transistors are most broadly used. Recently, an electroluminescence display device in which an LTPS thin-film transistor and an oxide semiconductor thin-film transistor are formed together on the same substrate is being developed.

SUMMARY

The inventors of the present disclosure have recognized that the operation characteristics of pixels can be improved by way of forming a plurality of thin-film transistors with different semiconductors.

In order to form the thin-film transistors with different semiconductors, the inventors of the present disclosure have invented a display device in which a plurality of thin-film transistors are formed on different layers without damage to semiconductor elements.

In view of the above, an object of the present disclosure is to provide a display device that can prevent damage to semiconductor elements during the process of fabricating the display device by way of forming a plurality of thin-film transistors with different semiconductor materials.

Objects of the present disclosure are not limited to the above-mentioned objects, and other objects, which are not mentioned above, can be clearly understood by those skilled in the art from the following descriptions.

According to an aspect of the present disclosure, there is provided a display device including: a substrate; a buffer layer disposed on the substrate; a first thin-film transistor comprising a first active layer made of a low-temperature poly-silicon (LTPS), a first gate electrode overlapping with the first active layer with the first gate insulating layer and the second gate insulating layer therebetween, and a first source electrode and a first drain electrode electrically connected to the first active layer; and a second thin-film transistor comprising a second active layer made of an oxide semiconductor, a second gate electrode overlapping with the second active layer with the second gate insulating layer therebetween, and a second source electrode and a second drain electrode electrically connected to the second active layer. The first gate electrode of the first thin-film transistor and the second gate electrode of the second thin-film transistor may be disposed on the second gate insulating layer According to an exemplary embodiment of the present disclosure, a display device may include a first thin-film transistor including a first active layer, a first gate electrode, a first source electrode and a first drain electrode, and a second thin-film transistor including a second active layer, a second gate electrode, a second source electrodes and a second drain electrode. The display device may include a substrate; a buffer layer disposed on the substrate; the first active layer disposed on the buffer layer and made of a low-temperature poly-silicon (LTPS); a first gate insulating layer disposed on the first active layer and the buffer layer; the second active layer disposed on the first gate insulating layer and made of an oxide semiconductor; a second gate insulating layer disposed on the second active layer and the first gate insulating layer; the first gate electrode and the second gate electrode disposed on the second gate insulating layer; an interlayer dielectric layer disposed over the first gate electrode, the second gate electrode and the second gate insulating layer; and the first source electrode, the first drain electrode, the second source electrode and the second drain electrode disposed on the interlayer dielectric layer.

Other detailed matters of the exemplary embodiments are included in the detailed description and the drawings.

According to an exemplary embodiment of the present disclosure, by disposing thin-film transistors including different semiconductor materials, the reliability of a display device can be improved.

According to an exemplary embodiment of the present disclosure, by forming an inorganic layer between two polyimide (PI) layers, it is possible to block charge charged in the polyimide (PI) layer disposed thereunder to thereby improve the reliability of a display device. In addition, the process of forming a metal layer to block the charge charged in the polyimide (PI) can be omitted, thereby simplifying the process and saving the fabrication cost.

According to an exemplary embodiment of the present disclosure, by disposing a blocking layer that is connected to and formed integrally with a capacitor electrode so that it overlaps with an active layer of a thin-film transistor including an oxide semiconductor, it is possible to prevent hydrogen generated in the substrate from diffusing into the active layer. In addition, by forming a buffer layer disposed between the blocking layer and the active layer as multiple layers including the top buffer layer having a relatively low hydrogen content and the bottom buffer layer having relatively high insulating properties, the top buffer layer in contact with the lower surface of the active layer can prevent hydrogen from diffusing into the active layer of the thin-film transistor including an oxide semiconductor material. In addition, the bottom buffer layer disposed between the blocking layer and the top buffer layer can prevent the charge charged in the blocking layer from being transferred to the active layer of the thin-film transistor.

According to an exemplary embodiment of the present disclosure, the first gate electrode of the first thin-film transistor, the second gate electrode of the second thin-film transistor, and the first capacitor electrode of the storage capacitor can be formed via a single process on the same layer, so that the processing steps can be reduced. Additionally, the fabrication cost can be saved by reducing the processing time.

Embodiments also relate to a display device including a substrate, a buffer layer disposed on the substrate, and a first thin-film transistor. The first thin-film transistor includes a first active layer made of a poly-silicon, a first part of a first gate insulating layer on the first active layer, a first part of a second gate insulating layer on the first part of the first gate insulating layer, and a first gate electrode overlapping with the first active layer on the first part of the second gate insulating layer. The display device further includes a second thin-film transistor. The second thin-film transistor includes a second active layer made of oxide semiconductor, a second part of the second gate insulating layer on the second active layer, and a second gate electrode overlapping with the second active layer on the second part of the second gate insulating layer.

Embodiments also relate to a display device including a substrate, a buffer layer disposed on the substrate, a first active layer disposed on the buffer layer. The first active layer may be made of poly-silicon. The display device further includes a first gate insulating layer disposed on the first active layer and the buffer layer, a second active layer disposed on the substrate. The second active layer may be made of oxide semiconductor. The display device further includes a second gate insulating layer disposed on the second active layer and the first gate insulating layer, a first gate electrode on the second gate insulating layer. The first gate electrode may overlap the first active layer. The display device further includes a second gate electrode on the second gate insulating layer. The second gate electrode may overlap the second active layer.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
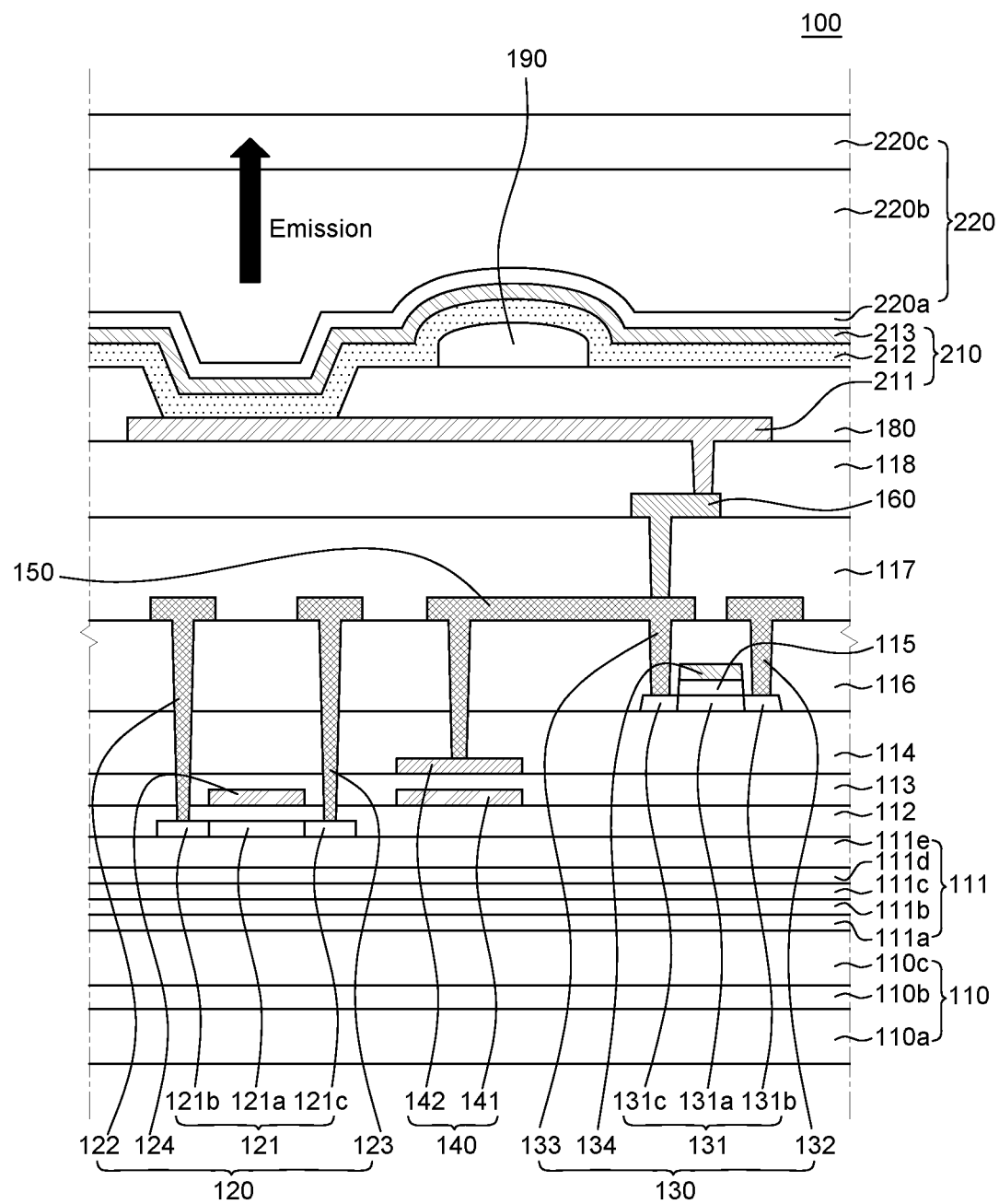
FIG. 1 is a cross-sectional view of a display device according to an exemplary embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two elements is described using the terms such as "on", "above", "below", and "next", one or more elements may be positioned between the two parts unless the terms are used with the term "immediately" or "directly".

When an element or a layer is "on" another element or another layer, it may be interpreted as such the other layer or the other element can be interposed on or in the middle of another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

Area and thickness of each element shown in the figures are merely for illustrative purpose for convenience of description, but are not necessarily limited to the area and thickness of the configuration of the present disclosure as illustrated.

Each of the features of the various embodiments of the present disclosure can be combined or combined with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

The display device according to the exemplary embodiments of the present disclosure can be applied to electroluminescence display devices such as an organic light-emitting display (OLED) device and a quantum-dot light-emitting display (QLED) device. It is, however, to be understood that the present disclosure is not limited thereto but can be equally applied to a variety of display devices. For example, the display device according to the exemplary embodiment of the present disclosure can be applied liquid-crystal display (LCD) devices.

FIG. 1 is a cross-sectional view of a display device according to an exemplary embodiment of the present disclosure.

Referring to FIG. 1, a display device 100 according to an exemplary embodiment of the present disclosure may include a substrate 110, a first buffer layer 111, a first thin-film transistor 120, a second thin-film transistor 130, a storage capacitor 140, a first gate insulating layer 112, a first interlayer dielectric layer 113, a second buffer layer 114, a second gate insulating layer 115, a second interlayer dielectric layer 116, a first planarization layer 117, a second planarization layer 118, a connection electrode 150, a bank 180, an auxiliary electrode 160, a spacer 190, a light-emitting element 210, and an encapsulation element 220.

The substrate 110 supports thereon a variety of elements of the display device 100. The substrate 110 may be made of glass or a plastic material having flexibility. When the substrate 110 is made of a plastic material, it may be made of, for example, polyimide (PI). When the substrate 110 is made of polyimide (PI), the display device may be fabricated with a glass support substrate under the substrate 110, and the support substrate may be released after the display device has been produced. After the support substrate is released, a back plate may be disposed under the substrate 110 to support it.

When the substrate 110 is made of polyimide (PI), moisture may permeate through the substrate 110 made of polyimide (PI) to reach the first thin-film transistor 120 or a light-emitting structure 200, such that the performance of the display device 100 may be deteriorated. The display device 100 according to the exemplary embodiment of the present disclosure may be implemented with a dual polyimide (PI) layer to prevent the performance of the display device 100 from being deteriorated by moisture permeation. In addition, by forming an inorganic layer between the two polyimide (PI) layers, it is possible to prevent moisture from pas sing through the polyimide (PI) thereunder, thereby improving the reliability of the display device.

When the substrate 110 is formed as the dual polyimide (PI) layer, the charge charged in the polyimide PI thereunder may form a back bias and may affect the first thin-film transistor 120. Therefore, it is necessary to forma separate metal layer in order to block the charge charged in the polyimide (PI). However, in the display device 100 according to the exemplary embodiment of the present disclosure, the inorganic layer is formed between two polyimide (PI) layers, thereby blocking the charge charged in the polyimide PI disposed thereunder, thereby improving the reliability. In addition, the process of forming a metal layer to block the charge charged in the polyimide (PI) can be omitted, thereby simplifying the process and saving the fabrication cost.

In a flexible display device using polyimide (PI) as the substrate 110, it is very important to ensure environment reliability and performance reliability of the panel.

The display device 100 according to the exemplary embodiment of the present disclosure can realize a structure for ensuring environment reliability of a display device by way of using a dual base layer as the substrate. For example, as shown in FIG. 1, the substrate 110 of the display device 100 may include a first base layer 110a, a second base layer 110c, and an inorganic insulating layer 110b formed between the first base layer 110a and the second base layer 110b. The inorganic insulating layer 110b can prevent the charge charged in the first base layer 110a from affecting the first thin-film transistor 120 through the second base layer 110b.

Further, the inorganic insulating layer 110b formed between the first base layer 110a and the second base layer 110c can block moisture from permeating through the first base layer 110a.

The inorganic insulating layer 110b may be made up of a single layer of silicon nitride (SiNx) or silicon oxide (SiOx) or multiple layers thereof. In the display device 100 according to the exemplary embodiment of the present disclosure, the inorganic insulating layer 110b may be made of silicon oxide (SiOx) material. For example, the inorganic insulating layer 110b may be made of a silicon oxide (SiOx) material, especially silica or silicon dioxide ($SiO_2$). It is, however, to be understood that the present disclosure is not limited thereto. The inorganic insulating layer 110b may be made up of a dual layer of silicon dioxide (SiO2) and silicon nitride (SiNx).

The first buffer layer 111 may be formed on the entire upper surface of the substrate 110. The first buffer layer 111 may be made up of a single layer of silicon nitride (SiNx) or silicon oxide (SiOx) or multiple layers thereof. For example, when the first buffer layer 111 is made up of multiple layers, the multiple layers may include a silicon nitride (SiNx) layer and a silicon dioxide (SiO2Ù) layer. The first buffer layer 111 can reinforce the adhesion between the layers formed on the first buffer layer 111 and the substrate 110 and can block alkaline components or the like flowing out of the substrate 110. It is to be understood that the first buffer layer 111 is not an essential element and may be eliminated depending on the type and material of the substrate 110, the structure and type of the thin-film transistor, etc.

According to the exemplary embodiment of the present disclosure, the first buffer layer 111 may be made up of multiple layers in which silicon nitride (SiNx) and silicon oxide (SiOx) are alternately formed. Specifically, the first buffer layer 111 may include (n+1) layers, where n denotes zero or an even number i.e., 2, 4, 6, 8, etc. Therefore, when n=0, the first buffer layer 111 is made up of a single layer. When the first buffer layer 111 is made up of a single layer, the first buffer layer 111 may be formed of a silicon nitride (SiNx) or silicon oxide (SiOx) material. On the other hand, when n=2, the first buffer layer 111 may be made up of a triple layer. When the first buffer layer 111 is made up of a triple layer, the upper and lower layers may be made of silicon oxide (SiOx), and the intermediate layer disposed between the upper and lower layers may be made of silicon nitride (SiNx). When n=4, the first buffer layer 111 may be made up of a five-layered structure. When the first buffer layer 111 is made up of a five-layered structure, a (1-a) buffer layer 111a may be formed on the substrate 110, as shown in FIG. 1. In addition, the (1-a) buffer layer 111a may be formed of a silicon oxide (SiOx) material. The (1-b) buffer layer 111b may be formed of a silicon nitride (SiNx) material and may be disposed on the (1-a) buffer layer 111a. The (1-c) buffer layer 111c may be formed of a silicon oxide (SiOx) material and may be disposed on the (1-b) buffer layer 111b. The (1-d) buffer layer 111d may be formed of a silicon nitride (SiNx) material and may be disposed on the (1-c) buffer layer 111c. The (1-e) buffer layer 111e may be formed of a silicon oxide (SiOx) material and may be disposed on the (1-d) buffer layer 111d. As such, when n is an even number greater than or equal to two, the first buffer layer 111 may be made up of multiple layers formed by alternately stacking silicon oxide (SiOx) and silicon nitride (SiNx). When the first buffer layer 111 is made up of multiple layers, the top layer and the bottom layer of multiple layers may be made of a silicon oxide (SiOx) material. The silicon oxide (SiOx) material may be a silicon dioxide ($SiO_2$) material.

For example, the first buffer layer 111 made up of multiple layers may include an upper layer in contact with the first active layer 121 of the first thin-film transistor 120, a lower layer in contact with the substrate 110, and an intermediate layer therebetween. The upper layer and the lower layer may be made of a silicon oxide (SiOx) material. The upper layer of the first buffer layer 111 made up of multiple layers may be formed thicker than the lower layer and the intermediate layer. In the first buffer layer 111 made up of multiple layers, the thickness of the upper layer in contact with the first active layer 121 of the first thin-film transistor 120 may be greater than the thickness of the lower and intermediate layers of the first buffer layer 111. For example, when the first buffer layer 111 is made up of a five-layered structure as shown in FIG. 1, the (1-e) buffer layer 111e in contact with the first active layer 121 may be the top layer. The (1-a) buffer layer 111a in contact with the substrate 110 may be the bottom layer. The (1-b) buffer layer 111b, the (1-c) buffer layer 111c and the (1-d) buffer layer 111d, which are disposed between the (1-a) buffer layer 111a and the (1-e) buffer layer 111e, may be intermediate layers. The thickness of the top layer, i.e., the (1-e) buffer layer 111e may be larger than the thickness of the bottom layer, i.e., the (1-a) buffer layer 111a, and the thickness of each of the intermediate layers, i.e., the (1-b) buffer layer 111b, the (1-c) buffer layer 111c and the (1-d) buffer layer 111d. More specifically, the thickness of the (1-e) buffer layer 111e may be 3,000 Å, and the thickness of the (1-a) buffer layer 111a may be 1,000 Å. It is, however, to be understood that the present disclosure is not limited thereto. The thickness of each of the (1-b) buffer layer 111b, the (1-c) buffer layer 111c and the (1-d) buffer layer 111d may be 1,000 Å. It is, however, to be understood that the thickness is not limited thereto.

In addition, when the first buffer layer 111 is made up of multiple layers, all of the layers other than the top layer in contact with the first active layer 121 of the first thin-film transistor 120 may have the same thickness. For example, the (1-a) buffer layer 111a, the (1-b) buffer layer 111b, the (1-c) buffer layer 111c and the (1-d) buffer layer 111d may have the same thickness, except the (1-e) buffer layer 111e in contact with the first active layer 121.

The first thin-film transistor 120 may be disposed on the first buffer layer 111. The first thin-film transistor 120 may include a first active layer 121, a first gate electrode 124, a first source electrode 122, and a first drain electrode 123. It is to be noted that the first source electrode 122 may be a drain electrode and the first drain electrode 123 may be a source electrode depending on design choice of the pixel circuit. The first active layer 121 of the first thin-film transistor 120 may be disposed on the first buffer layer 111.

The first active layer 121 may include low-temperature poly-silicon (LTPS). Since the poly-silicon material has a high mobility (100 cm$^2$/Vs or higher), it has low energy consumption power and high reliability. Accordingly, the poly-silicon material may be employed as a gate driver for driving thin-film transistors for display elements and/or a multiplexer (MUX). In the display device according to the exemplary embodiment of the present disclosure, it may be employed as, but is not limited to, the active layer of a driving thin-film transistor. For example, it may be employed as an active layer of a switching thin-film transistor depending on the characteristics of a display device. An amorphous silicon (a-Si) material may be deposited on the first buffer layer 111, a dehydrogenation process and a crystallization process may be carried out to form poly-silicon, and the poly-silicon may be patterned to form the first active layer 121. The first active layer 121 may include a first channel region 121a in which a channel is formed when the first thin-film transistor 120 is driven, and a first source region 121b and a first drain region 121c on both sides of the first channel region 121a, respectively. The first source region 121b may be a part of the first active layer 121 connected to the first source electrode 122, and the first drain region 121c may be a part of the first active layer 121 connected to the first drain electrode 123. The first source region 121b and the first drain region 121c may be formed by ion doping (impurity doping) of the first active layer 121. The first source region 121b and the first drain region 121c may be formed by doping ions into a poly-silicon material, and the first channel region 121a may be the remaining part of the poly-silicon material that is not doped with ions.

The first gate insulating layer 112 may be disposed on the first active layer 121 of the first thin-film transistor 120. The first gate insulating layer 112 may be made up of a single layer of silicon nitride (SiNx) or silicon oxide (SiOx) or multiple layers thereof. Contact holes may be formed in the first gate insulating layer 112, via which the first source electrode 122 and the first drain electrode 123 of the first thin-film transistor 120 are connected to the first source region 121b and the first drain region 121c of the first active layer 121 of the first thin-film transistor 120, respectively.

The first gate electrode 124 of the first thin-film transistor 120 and a first capacitor electrode 141 of the storage capacitor 140 may be disposed on the first gate insulating layer 112.

The first gate electrode 124 and the first capacitor electrode 141 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof. The first gate electrode 124 may be formed on the first gate insulating layer 112 so that it overlaps with the first channel region 121a of the first active layer 121 of the first thin-film transistor 120. The first capacitor electrode 141 may be eliminated based on the driving characteristics of the display device 100, the structure and type of the thin-film transistor, and the like. The first gate electrode 124 and the first capacitor electrode 141 may be formed via the same process. The first gate electrode 124 and the first capacitor electrode 141 may be made of the same material and may be formed on the same layer.

The first interlayer dielectric layer 113 may be disposed on the first gate insulating layer 112, the first gate electrode 124, and the first capacitor electrode 141. The first interlayer dielectric layer 113 may be made up of a single layer of silicon nitride (SiNx) or silicon oxide (SiOx) or multiple layers thereof. Contact holes may be formed in the first interlayer dielectric layer 113, via which the first source region 121b and the first drain region 121c of the first active layer 121 of the first thin-film transistor 120 are exposed.

A second capacitor electrode 142 of the storage capacitor 140 may be disposed on the first interlayer dielectric layer 113. The second capacitor electrode 142 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof. The second capacitor electrode 142 may be formed on the first interlayer dielectric layer 113 so that it overlaps with the first capacitor electrode 141. In addition, the second capacitor electrode 142 may be formed of the same material as the first capacitor electrode 141. The second capacitor electrode 142 may be eliminated based on the driving characteristics of the display device 100, the structure and type of the thin film transistor, and the like.

The second buffer layer 114 may be disposed on the first interlayer dielectric layer 113 and the second capacitor electrode 142. The second buffer layer 114 may be made up of a single layer of silicon nitride (SiNx) or silicon oxide (SiOx) or multiple layers thereof. Contact holes may be formed in the second buffer layer 114, via which the first source region 121b and the first drain region 121c of the first active layer 121 of the first thin-film transistor 120 are exposed. In addition, a contact hole may be formed to expose the second capacitor electrode 142 of the storage capacitor 140.

The second active layer 131 of the second thin-film transistor 131 may be disposed on the second buffer layer 114. The second thin-film transistor 130 may include a second active layer 131, a second gate insulating layer 115, a second gate electrode 134, a second source electrode 132 and a second drain electrode 133. It is to be noted that the second source electrode 132 may be a drain electrode and the second drain electrode 133 may be a source electrode depending on design choice of the pixel circuit.

The second active layer 131 may include a second channel region 131a in which a channel is formed when the second thin-film transistor 130 is driven, and a second source region 131b and a second drain region 131c on both sides of the second channel region 131a, respectively. The second source region 131b may be a part of the second active layer 131 connected to the second source electrode 132, and the second drain region 131c may be a part of the second active layer 131 connected to the second drain electrode 133.

The second active layer 131 may be made of an oxide semiconductor. Since the oxide semiconductor material has a larger band gap than the silicon material, electrons cannot go over the band gap in the off state, and thus the off-current is low. Therefore, the thin-film transistor including the active layer made of an oxide semiconductor may be suitable for a switching thin-film transistor which has a shorter on-time and a longer off-time. It is, however, to be understood that the present disclosure is not limited thereto. Depending on the characteristics of the display device, it may be applied as a driving thin-film transistor. In addition, since it has a small off-current, the auxiliary capacitance can be reduced, and thus it is suitable for a high-resolution display element. For example, the second active layer 131 may be made of a metal oxide and may be made of various metal oxides such as indium-gallium-zinc-oxide (IGZO). Although the second active layer 131 of the second thin-film transistor 130 is described as being formed based on the IGZO layer made of IGZO among various metal oxides, this is merely illustrative. The second active layer 131 may be made of other metal oxides such as indium-zinc-oxide (IZO), indium-gallium-tin-oxide (IGTO) and indium-gallium-oxide (IGO).

The second active layer 131 may be formed by depositing a metal oxide on the second buffer layer 114, performing a heat treatment process for stabilization, and then patterning the metal oxide.

An insulating material layer and a metal material layer may be sequentially formed on the entire surface of the substrate including the second active layer 131, and a photoresist pattern may be formed on the metal material layer.

The insulating material layer may be formed by plasma-enhanced chemical vapor deposition (PECVD), and the metal material layer may be formed by sputtering.

The second gate electrode 134 may be formed by wet-etching the metal material layer using a photoresist pattern PR as a mask. As an etchant for wet-etching the metal material layer, a material that can selectively etch the material of the metal material layer, i.e., one of molybdenum (Mo), copper (Cu), titanium (Ti), aluminum (Al), chrome (Cr), gold (Au), nickel (Ni) and neodymium (Nd) or an alloy thereof but does not etch the insulating material layer can be used.

The second gate insulating layer 115 may be formed by dry-etching the insulating material layer using the photoresist pattern PR and the second gate electrode 134 as masks.

The insulating material layer may be etched out via the dry etching process, so that a pattern of the second gate insulating layer 115 may be formed on the second active layer 131. A part of the second active layer 131 exposed via the patterned second gate insulating layer 115 may be made conductive via the dry etching process.

The second active layer 131 may be formed, which includes the second channel region 131a that is in line with the second gate electrode 134 and is not made conductive, and the second source region 131b and the second drain region 131c that are made conductive on both ends of the second active layer 131.

As the second source region 131b and the second drain region 131c of the second active layer 131 are made conductive, their resistance becomes lower, so that the performance of the second thin-film transistor 130 can be improved. Accordingly, the reliability of the display device 100 according to the exemplary embodiment of the present disclosure can be improved.

The second channel region 131a of the second active layer 131 may overlap with the second gate electrode 134. The second source region 131b and the second drain region 131c of the second active layer 131 may be disposed on both sides of the second channel region 131a, respectively. The second gate insulating layer 115 may be disposed between the second gate electrode 134 and the second active layer 131. The second gate insulating layer 115 may be disposed so as to overlap with the second gate electrode 134 and the second channel region 131a of the second active layer 131.

By etching the insulating material layer and the metal material layer using the photoresist pattern PR as a mask, the second gate insulating layer 115 and the second gate electrode 134 may be formed in the same pattern. The second gate insulating layer 115 may be disposed on the second active layer 131. The second gate insulating layer 115 may be made up of a single layer of silicon nitride (SiNx) or silicon oxide (SiOx) or multiple layers thereof. The second gate insulating layer 115 may be patterned to overlap with the second channel region 131a of the second active layer 131. The second gate electrode 134 may be disposed on the second gate insulating layer 114. The second gate electrode 134 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof. The second gate electrode 134 may be patterned to overlap with the second active layer 131 and the second gate insulating layer 115. The second electrode 134 may be patterned to overlap with the second channel region 131a of the second active layer 131. In addition, the second gate insulating layer 115 may be patterned to overlap with the second channel region 131a of the second active layer 131. Accordingly, the second gate electrode 134 and the second gate insulating layer 115 may overlap with the second channel region 131a of the second active layer 131. The second interlayer dielectric layer 116 may be disposed on the second buffer layer 114, the second active layer 131, and the second gate electrode 134. Contact holes may be formed in the second interlayer dielectric layer 116, via which the first active layer 121 of the first thin-film transistor 120 and the second active layer 131 of the second thin-film transistor 130 are exposed. For example, contact holes may be formed in the second interlayer dielectric layer 116, via which the first source region 121b and the first drain region 121c of the first active layer 121 of the first thin-film transistor 120 are exposed. In addition, contact holes may be formed in the second interlayer dielectric layer 116, via which the second source region 131b and the second drain region 131c of the second active layer 131 of the second thin-film transistor 130 are exposed. The second interlayer dielectric layer 116 may be made up of a single layer of silicon nitride (SiNx) or silicon oxide (SiOx) or multiple layers thereof.

The connection electrode 150, the first source electrode 122 and the first drain electrode 123 of the first thin-film transistor 120, and the second source electrode 132 and the second drain electrode 133 of the second thin-film transistor 130 may be disposed on the second interlayer dielectric layer 116.

The first source electrode 122 and the first drain electrode 123 of the first thin-film transistor 120 may be connected to the first active layer 121 of the first thin-film transistor 120 through the contact holes formed through the first gate insulating layer 112, the first interlayer dielectric layer 113, the second buffer layer 114, and the second interlayer dielectric layer 116. Accordingly, the first source electrode 122 of the first thin-film transistor 120 may be connected to the first source region 121b of the first active layer 121 through the contact hole formed through the first gate insulating layer 112, the first interlayer dielectric layer 113, the second buffer layer 114 and the second interlayer dielectric layer 116. In addition, the first drain electrode 123 of the first thin-film transistor 120 may be connected to the first drain region 121c of the first active layer 121 through the contact hole formed through the first gate insulating layer 112, the first interlayer dielectric layer 113, the second buffer layer 114 and the second interlayer dielectric layer 116.

The connection electrode 150 may be electrically connected to the second drain electrode 133 of the second thin-film transistor 130. The connection electrode 150 may be electrically connected to the second capacitor electrode 142 of the storage capacitor 140 through the contact hole formed through the second buffer layer 114 and the second interlayer dielectric layer 116. Accordingly, the connection electrode 150 may electrically connect the second capacitor electrode 142 of the storage capacitor 140 with the second drain electrode 133 of the second thin-film transistor 130.

The second source electrode 132 and the second drain electrode 133 of the second thin-film transistor 130 may be connected to the second active layer 131 through the contact hole formed in the second interlayer dielectric layer 116. Accordingly, the second source electrode 132 of the second thin-film transistor 130 may be connected to the second source region 131b of the second active layer 131 through a contact hole formed in the second interlayer dielectric layer 116, and the second drain electrode 133 of the second thin-film transistor 130 may be connected to the second drain region 131c of the second active layer 131 through a contact hole formed in the second interlayer dielectric layer 116.

The connection electrode 150, the first source electrode 122 and the first drain electrode 123 of the first thin-film transistor 120, and the second source electrode 132 and the second drain electrode 133 of the second thin-film transistor 130 may be formed via the same process. The connection electrode 140, the first source electrode 122 and the first drain electrode 123 of the first thin-film transistor 120, and the second source electrode 132 and the second drain electrode 133 of the second thin-film transistor 130 may be made of the same material. The connection electrode 140, the first source electrode 122 and the first drain electrode 123 of the first thin-film transistor 120, and the second source electrode 132 and the second drain electrode 132 of the second thin-film transistor 130 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof. For example, the connection electrode 140, the first source electrode 122 and the first drain electrode 123 of the first thin-film transistor 120, and the second source electrode 132 and the second drain electrode 133 of the second thin-film transistor 130 may be made up of, but is not limited to, a triple layer structure of titanium (Ti)/aluminum (Al)/titanium (Ti) made of a conductive metal material.

The connection electrode 150 may be connected to and formed integrally with the second drain electrode 133 of the second thin-film transistor 130.

The first planarization layer 117 may be disposed over the connection electrode 140, the first source electrode 122 and the first drain electrode 123 of the first thin-film transistor 120, over the second source electrode 132 and the second drain electrode 133 of the second thin-film transistor 130 and on the second interlayer dielectric layer 116. As shown in FIG. 1, a contact hole may be formed in the first planarization layer 117, via which the second drain electrode 133 is exposed. It is, however, to be understood that the present disclosure is not limited thereto. For example, a contact hole for exposing the second source electrode 132 of the second thin-film transistor 130 may be formed in the first planarization layer 117. Alternatively, a contact hole for exposing the connection electrode 150 electrically connected to the second drain electrode 133 of the second thin-film transistor 130 may be formed in the first planarization layer 117. The first planarization layer 117 may be an organic material layer for protect the first and second thin-film transistors 120 and 130 and for providing a flat surface over them. For example, the planarization layer 118 may be formed of an organic material such as an acryl resin, an epoxy resin, a phenolic resin, a polyamide resin and a polyimide resin.

The auxiliary electrode 160 may be disposed on the first planarization layer 117. In addition, the auxiliary electrode 160 may be connected to the second drain electrode 133 of the second thin-film transistor 130 through the contact hole of the first planarization layer 117. The auxiliary electrode 160 may serve to electrically connect the second thin-film transistor 130 with a first electrode 211 of the light-emitting element 210. The auxiliary electrode 160 may electrically connect the second thin-film transistor 130 with the light-emitting element 210. The light-emitting element 210 may include the first electrode 211, a light-emitting structure 212, and a second electrode 213. The auxiliary electrode 160 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof. The auxiliary electrode 160 may be made of the same material as the second source electrode 132 and the second drain electrode 133 of the second thin-film transistor 130.

The second planarization layer 118 may be disposed over the auxiliary electrode 160 and on the first planarization layer 117. In addition, as shown in FIG. 1, a contact hole for exposing the auxiliary electrode 160 may be formed in the second planarization layer 118. The second planarization layer 118 may be an organic material layer for providing a flat surface over the first and second thin-film transistors 120 and 130. For example, the second planarization layer 118 may be formed of an organic material such as an acryl resin, an epoxy resin, a phenolic resin, a polyamide resin and a polyimide resin.

The first electrode 211 may be disposed on the second planarization layer 118. The first electrode 211 may be electrically connected to the auxiliary electrode 160 through a contact hole formed in the second planarization layer 118. Accordingly, the first electrode 170 may be electrically connected to the second thin-film transistor 130 by being connected to the auxiliary electrode 160 through the contact hole formed in the second planarization layer 118.

The first electrode 211 may be made up of a multiple-layer structure including a transparent conductive layer and an opaque conductive layer having a high reflection efficiency. The transparent conductive layer may be made of a material having a relatively high work function such as indium-tin-oxide (ITO) and indium-zinc-oxide (IZO). The opaque conductive layer may be made up of a single layer or a multi-layer structure including Al, Ag, Cu, Pb, Mo, Ti, or an alloy thereof. For example, the first electrode 211 may be formed by sequentially stacking a transparent conductive layer, an opaque conductive layer, and a transparent conductive layer. It is, however, to be understood that the present disclosure is not limited thereto. The first electrode 211 may be formed by sequentially stacking a transparent conductive layer and an opaque conductive layer.

Since the display device 100 according to the exemplary embodiment of the present disclosure is a top-emission display device (indicated by the arrow in FIG. 1), the first electrode 211 may be an anode electrode. When the display device 100 is a bottom-emission display device, the first electrode 211 disposed on the second planarization layer 118 may be a cathode electrode.

The bank 180 may be disposed on the first electrode 211 and the second planarization layer 118. An opening for exposing the first electrode 211 may be formed in the bank 180. Since the bank 180 can define the emission area of the display device 100, the bank 180 may also be referred to as a pixel-defining layer. The spacer 190 may be further disposed on the bank 180. Further, the light-emitting structure 212 including an emissive layer may be further disposed on the first electrode 211.

The light-emitting structure 212 may be formed on the first electrode 211 in the order of a hole layer, an emissive layer and an electron layer or in the reverse order. Besides, the light-emitting structure 212 may include first and second light-emitting structures that face each other with a charge generation layer interposed therebetween. In such case, one of the first and second light-emitting structures produces blue light while the other one of the first and second light-emitting structures produces yellow-green light, so that white light can be produced by the first and second light-emitting structures. The white light produced from the light-emitting structure 212 can be incident on a color filter (not shown) located above the light-emitting structure 212 to represent a color image. Besides, the light-emitting structure 212 can produce light of different colors for different sub-pixels, so that it is possible to represent color images without an additional color filter. That is to say, the light-emitting structure 212 of the red sub-pixel (R) may emit red light, the light-emitting structure 212 of the green sub-pixel (G) may emit green light, and the light-emitting structure 212 of the blue sub-pixel (B) may emit blue light.

The second electrode 213 may be further disposed on the light-emitting structure 212. The second electrode 213 may be disposed on the light-emitting structure 212 so that it faces the first electrode 211 with the light-emitting structure 212 therebetween. In the display device 100 according to the exemplary embodiment of the present disclosure, the second electrode 213 may be a cathode electrode. The encapsulation element 220 for suppressing moisture permeation may be further disposed on the second electrode 213 of the light-emitting element 210.

The encapsulation element 220 may include a first inorganic encapsulation layer 220a, a second organic encapsulation layer 220b, and a third inorganic encapsulation layer 220c. The first inorganic encapsulation layer 220a of the encapsulation element 220 may be disposed on the second electrode 210. The second organic encapsulation layer 220b may be disposed on the first inorganic encapsulation layer 220a. In addition, the third inorganic encapsulation layer 220c may be disposed on the second organic encapsulation layer 220b. The first inorganic encapsulation layer 220a and the third inorganic encapsulation layer 220c of the encapsulation element 220 may be formed of an inorganic material such as silicon nitride (SiNx) and silicon oxide (SiOx). The second organic encapsulation layer 220b of the encapsulation element 220 may be formed of an organic material such as an acryl resin, an epoxy resin, a phenolic resin, a polyamide resin and a polyimide resin.

Figure 2:
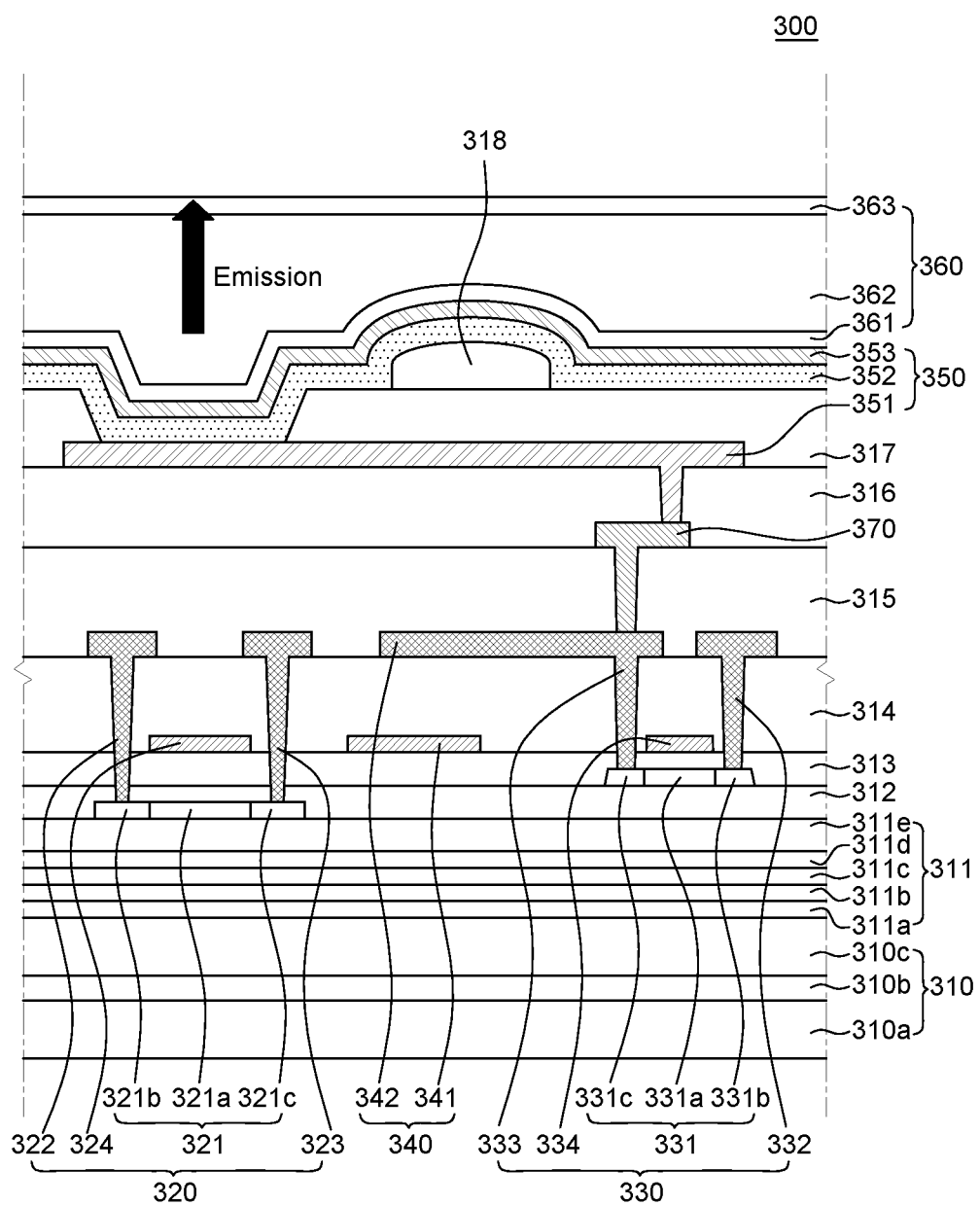
FIG. 2 is a cross-sectional view of a display device according to another exemplary embodiment of the present disclosure.

FIG. 2 is a cross-sectional view of a display device according to another exemplary embodiment of the present disclosure. The description will focus on differences and the redundant description will be omitted. For example, a substrate 310, a buffer layer 311, a light-emitting element 350, a bank 317, a spacer 318 and an encapsulation element 360 are substantially identical to those of the above-described exemplary embodiment of the present disclosure. Therefore, the redundant description will be omitted.

Referring to FIG. 2, a display device 300 according to another exemplary embodiment of the present disclosure may include a substrate 310, a buffer layer 311, a first thin-film transistor 320, a second thin-film transistor 330, a first gate insulating layer 312, a second gate insulating layer 313, an interlayer dielectric layer 314, a first protective layer 315, a second protective layer 316, a storage capacitor 340, a bank 317, an auxiliary electrode 379, a spacer 318, a light-emitting element 350, and an encapsulation element 360. A first active layer 321 of the first thin-film transistor 320 may be made of a low-temperature poly-silicon (LTPS) material, and a second active layer 331 of the second thin-film transistor 330 may be made of an oxide semiconductor.

A buffer layer 311 may be disposed on the substrate 310. The buffer layer 311 is substantially identical to the first buffer layer 111 of FIG. 1.

The first thin-film transistor 320 may be disposed on the buffer layer 311. The first thin-film transistor 320 may include a first active layer 321, a first gate electrode 324, a first source electrode 322, and a first drain electrode 323. The first active layer 321 of the first thin-film transistor 320 may be disposed on the first buffer layer 311. The lower surface of the first active layer 321 may be in direct contact with the upper surface of the buffer layer 311.

The first active layer 321 may include low-temperature poly-silicon (LTPS). The first active layer 321 may include a first channel region 321a in which a channel is formed when the first thin-film transistor 320 is driven, and a first source region 321b and a first drain region 321c on both sides of the first channel region 321a, respectively. The first source region 321*b* may be a part of the first active layer 321 connected to the first source electrode 322, and the first drain region 321*c* may be a part of the first active layer 321 connected to the first drain electrode 323. The first source region 321*b* and the first drain region 321*c* may be formed by doping ions into a poly-silicon material, and the first channel region 321*a* may be the remaining part of the poly-silicon material that is not doped with ions. The first gate insulating layer 312 may be disposed on the buffer layer 311 and the first active layer 321 of the first thin-film transistor 320. For example, a first part of the first gate insulating layer 312 may be disposed on the first active layer 321. The lower surface of the first gate insulating layer 312 may be in direct contact with the upper surface of the first active layer 321 and the upper surface of the buffer layer 311. The first gate insulating layer 312 may be made up of a single layer of silicon nitride (SiNx) or silicon oxide (SiOx) or multiple layers thereof. Contact holes may be formed in the first gate insulating layer 312, via which the first source electrode 322 and the first drain electrode 323 of the first thin film transistor 320 are connected to the first source region 321*b* and the first drain region 321*c* of the first active layer 321 of the first thin film transistor 320, respectively.

The second active layer 331 of the second thin-film transistor 330 may be disposed on the first gate insulating layer 312. For example, the second active layer 331 may be disposed on a second part of the first gate insulating layer 312. The lower surface of the second active layer 331 may be in direct contact with the upper surface of the first gate insulating layer 312. The second thin-film transistor 330 may include a second active layer 331, a second gate electrode 334, a second source electrode 332, and a second drain electrode 333. The first gate insulating layer 312 may be disposed between the lower surface of the second active layer 331 and the upper surface of the first active layer 321.

The second active layer 331 may include a second channel region 331*a* in which a channel is formed when the second thin-film transistor 330 is driven, and a second source region 331*b* and a second drain region 331*c* on both sides of the second channel region 331*a*, respectively. The second source region 331*b* may be a part of the second active layer 331 connected to the second source electrode 332, and the second drain region 331*c* may be a part of the second active layer 331 connected to the second drain electrode 333. The second active layer 331 may be made of an oxide semiconductor.

The second gate insulating layer 313 may be disposed on the first gate insulating layer 312 and the second active layer 331 of the second thin-film transistor 330. For example, a first part of the second gate insulating layer 313 may be disposed on the first part of the first gate insulating layer 312, and a second part of the second gate insulating layer 313 may be disposed on the second active layer 331. The lower surface of the second gate insulating layer 313 may be in direct contact with the upper surface of the second active layer 331 and the upper surface of the first gate insulating layer 312. The second gate insulating layer 313 may be made up of a single layer of silicon nitride (SiNx) or silicon oxide (SiOx) or multiple layers thereof. Contact holes may be formed in the second gate insulating layer 313, via which the first source electrode 322 and the first drain electrode 323 of the first thin-film transistor 320 are connected to the first source region 321*b* and the first drain region 321*c* of the first active layer 321 of the first thin-film transistor 320, respectively. In addition, contact holes may be formed in the second gate insulating layer 313, via which the second source electrode 332 and the second drain electrode 333 of the second thin-film transistor 333 are connected to the second source region 331*b* and the second drain region 331*c* of the second active layer 331 of the second thin-film transistor 330, respectively. In one instance, the second gate insulating layer 313 does not need to be separately etched into a pattern, and thus, the first part of the second gate insulating layer 313 and the second part of the second gate insulating layer 313 may physically be connected to one another.

The first gate electrode 324 of the first thin-film transistor 320, the second gate electrode 334 of the second thin-film transistor 330 and the first capacitor electrode 341 of the storage capacitor 340 may be disposed on the second gate insulating layer 313.

The first gate electrode 324, the first capacitor electrode 341 and the second gate electrode 334 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof. The first gate electrode 324 may be formed on the second gate insulating layer 313 so that it overlaps with the first channel region 321*a* of the first active layer 321 of the first thin film transistor 320. For example, the first gate electrode 324 may be disposed on the first part of the second gate insulating layer 313. The first capacitor electrode 341 may be eliminated based on the driving characteristics of the display device 300, the structure and type of the thin-film transistor, and the like. The second gate electrode 334 may be formed on the second gate insulating layer 313 so that it overlaps with the second channel region 331*a* of the second active layer 331 of the second thin-film transistor 330. For example, the second gate electrode 334 may be disposed on the second part of the second gate insulating layer 313. The first gate electrode 324, the second gate electrode 334 and the first capacitor electrode 341 may be formed via the same process. The first gate electrode 324, the gate electrode 334 and the first capacitor electrode 341 may be made of the same material and may be formed on the same layer.

The lower surface of each of the first gate electrode 324, the first capacitor electrode 341 and the second gate electrode 334 may be in direct contact with the upper surface of the second gate insulating layer 313. In the display device 300 according to the exemplary embodiment of the present disclosure, the first gate electrode 324, the second gate electrode 334 and the first capacitor electrode 341 can be formed via a single process on the same layer, thereby saving the processing steps. Additionally, the fabrication cost can be saved by reducing the processing time.

The first gate electrode 324 may be disposed to overlap with the first active region 321*a* of the first active layer 321 with the first gate insulating layer 312 and the second gate insulating layer 313 therebetween. The second gate electrode 334 may be disposed to overlap with the second active region 331*a* of the second active layer 331 with the second gate insulating layer 313 therebetween. For example, the first gate insulating layer 312 and the second gate insulating layer 313 may be disposed between the upper surface of the first active layer 321 and the lower surface of the first gate electrode 324. The lower surface of the first gate electrode 324 may face the upper surface of the first active layer 321 with the first gate insulating layer 312 and the second gate insulating layer 313 therebetween. In addition, the second gate insulating layer 313 may be disposed between the upper surface of the second active layer 331 and the lower surface of the second gate electrode 334. In addition, the lower surface of the second gate electrode 334 may face the upper surface of the second active layer 331 with the second gate insulating layer 313 therebetween.

The interlayer dielectric layer 314 may be disposed over the second gate insulating layer 313, the first gate electrode 324, the first capacitor electrode 341 and the second gate electrode 334. The interlayer dielectric layer 314 may be made up of a single layer of silicon nitride (SiNx) or silicon oxide (SiOx) or multiple layers thereof. Contact holes may be formed in the interlayer dielectric layer 114, via which the first source region 321b and the first drain region 321c of the first active layer 321 of the first thin-film transistor 320 are exposed. In addition, contact holes may be formed in the interlayer dielectric layer 314, via which the second source region 331b and the second drain region 331c of the second active layer 331 of the second thin-film transistor 330 are exposed.

The first source electrode 322 and the first drain electrode 323 of the first thin-film transistor 320, and the second source electrode 332 and the second drain electrode 333 of the second thin-film transistor 330 and the second capacitor electrode 342 of the storage capacitor 340 may be disposed on the interlayer dielectric layer 314. The first source electrode 322, the first drain electrode 323, the second source electrode 332 and the second drain electrode 333 and the second capacitor electrode 342 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof.

The first source electrode 322, the first drain electrode 323, the second source electrode 332, the second drain electrode 333 and the second capacitor electrode 342 may be formed via the same process. The first source electrode 322, the first drain electrode 323, the second source electrode 332, the second drain electrode 333 and the second capacitor electrode 342 may be made of the same material and may be formed on the same layer. The second capacitor electrode 342 and the second drain electrode 333 may be connected to and formed integrally with each other. Thus, at least a portion of the first source electrode 322, the first drain electrode 323, at least a portion of the second source electrode 332, the second drain electrode 333, and the second capacitor electrode 342 may be disposed on the interlayer insulating layer 314.

The first source electrode 322 and the first drain electrode 323 of the first thin-film transistor 320 may be connected to the first source region 321b and the first drain region 321c of the first active layer 321 through contact holes of the first gate insulating layer 312, the second gate insulating layer 313, and the interlayer insulating layer 314.

The second source electrode 332 and the second drain electrode 333 of the first thin-film transistor 330 may be connected to the second source region 331b and the second drain region 331c of the second active layer 331 through contact holes of the second gate insulating layer 313 and the interlayer insulating layer 314.

The second capacitor electrode 342 may be disposed so that it overlaps with the first capacitor electrode 341 with the interlayer dielectric layer 314 interposed therebetween. In addition, the second capacitor electrode 342 may be formed of the same material as the first capacitor electrode 341.

The first protective layer 315 may be disposed over the interlayer dielectric layer 314, the first source electrode 322 and the first drain electrode 323 of the first thin-film transistor 320, the second source electrode 332 and the second drain electrode 333 of the second thin-film transistor 330 and the second capacitor electrode 342 of the storage capacitor 340. The first protective layer 315 may be an inorganic material layer for protecting the thin-film transistors disposed therebelow. For example, the first protective layer 315 may be made up of a single layer of silicon nitride (SiNx) or silicon oxide (SiOx) or multiple layers thereof. It is, however, to be understood that the present disclosure is not limited thereto. The first protective layer 315 may be an inorganic material layer for providing a flat upper surface and for protecting the thin-film transistors disposed therebelow. For example, the first protective layer 315 may be formed of an organic material such as an acryl resin, an epoxy resin, a phenolic resin, a polyamide resin and a polyimide resin.

A contact hole may be formed in the first protective layer 315 for exposing the second drain electrode 333 of the second thin-film transistor 330. It is, however, to be understood that the present disclosure is not limited thereto. For example, a contact hole for exposing the second source electrode 332 of the second thin-film transistor 330 may be formed in the first protective layer 315. Alternatively, a contact hole for exposing the first source electrode 322 and the first drain electrode 323 of the first thin-film transistor 3210 may be formed in the first protective layer 315.

An auxiliary electrode 370 may be disposed on the first passivation layer 315. In addition, the auxiliary electrode 370 may be connected to the second drain electrode 333 of the second thin-film transistor 330 through the contact hole of the first protective layer 315. The auxiliary electrode 370 may electrically connect the second drain electrode 333 of the second thin-film transistor 330 with a first electrode 351 of the light-emitting element 350. The auxiliary electrode 370 may electrically connect the second thin film transistor 330 with the light-emitting element 350. The light-emitting element 350 may include the first electrode 351, a light-emitting structure 352, and a second electrode 353. The auxiliary electrode 370 may be made up of a single layer of one of molybdenum (Mo), copper (Cu), titanium (Ti), aluminum (Al), chromium (Cr), gold (Au), nickel (Ni) and neodymium (Nd) and an alloy thereof, or multiple layers thereof. The auxiliary electrode 370 may be made of the same material as the second source electrode 332 and the second drain electrode 333 of the second thin-film transistor 330.

The second protective layer 316 may be disposed on the auxiliary electrode 370 and the first planarization layer 315. In addition, as shown in FIG. 2, a contact hole for exposing the auxiliary electrode 370 may be formed in the second protective layer 316. The second protective layer 316 may be an organic material layer for providing a flat surface over the first and second thin-film transistors 320 and 330. For example, the second protective layer 316 may be formed of an organic material such as an acryl resin, an epoxy resin, a phenolic resin, a polyamide resin and a polyimide resin.

The first electrode 351 may be disposed on the second protective layer 316. The first electrode 351 may be electrically connected to the auxiliary electrode 370 through a contact hole formed in the second protective layer 316. Accordingly, the first electrode 351 may be electrically connected to the second thin-film transistor 330 by being connected to the auxiliary electrode 370 through the contact hole formed in the second protective layer 316.

The bank 317 may be disposed on the first electrode 351 and the second protective layer 316. An opening for exposing the first electrode 351 may be formed in the bank 317. Since the bank 317 can define the emission area of the display device 300, the bank 180 may also be referred to as a pixel-defining layer. The spacer 318 may be further disposed on the bank 317. Further, the light-emitting structure 351 including an emissive layer may be further disposed on the first electrode 352.

The light-emitting structure 352 may be formed on the first electrode 211 in the order of a hole layer, an emissive layer and an electron layer or in the reverse order. Besides, the light-emitting structure 352 may include first and second light-emitting structures that face each other with a charge generation layer interposed therebetween. In such case, one of the first and second light-emitting structures produces blue light while the other one of the first and second light-emitting structures produces yellow-green light, so that white light can be produced by the first and second light-emitting structures. The white light produced from the light-emitting structure 352 can be incident on a color filter (not shown) located above the light-emitting structure 352 to represent a color image. Besides, the light-emitting structure 352 can produce light of different colors for different sub-pixels, so that it is possible to represent color images without an additional color filter. That is to say, the light-emitting structure 352 of the red sub-pixel (R) may emit red light, the light-emitting structure 352 of the green sub-pixel (G) may emit green light, and the light-emitting structure 352 of the blue sub-pixel (B) may emit blue light.

The second electrode 352 may be further disposed on the light-emitting structure 353. The second electrode 353 may be disposed on the light-emitting structure 352 so that it faces the first electrode 351 with the light-emitting structure 352 therebetween. The encapsulation element 360 for suppressing moisture permeation may be further disposed on the light-emitting element 350 including the first electrode 351, the light-emitting structure 352 and the second electrode 353.

The encapsulation element 360 may include a first inorganic encapsulation layer 361a, a second organic encapsulation layer 362, and a third inorganic encapsulation layer 363. The first inorganic encapsulation layer 361 of the encapsulation element 360 may be disposed on the second electrode 352. The second organic encapsulation layer 362 may be disposed on the first inorganic encapsulation layer 361. In addition, the third inorganic encapsulation layer 363 may be disposed on the second organic encapsulation layer 362. The first inorganic encapsulation layer 361 and the third inorganic encapsulation layer 363 of the encapsulation element 360 may be formed of an inorganic material such as silicon nitride (SiNx) and silicon oxide (SiOx). The second organic encapsulation layer 362 of the encapsulation element 360 may be formed of an organic material such as an acryl resin, an epoxy resin, a phenolic resin, a polyamide resin and a polyimide resin.

The exemplary embodiments of the present disclosure can also be described as follows:

According to an aspect of the present disclosure, there is provided a display device including: a substrate; a buffer layer disposed on the substrate; a first thin-film transistor comprising a first active layer made of a low-temperature poly-silicon (LTPS), a first gate electrode overlapping with the first active layer with the first gate insulating layer and the second gate insulating layer therebetween, and a first source electrode and a first drain electrode electrically connected to the first active layer; and a second thin-film transistor comprising a second active layer made of an oxide semiconductor, a second gate electrode overlapping with the second active layer with the second gate insulating layer therebetween, and a second source electrode and a second drain electrode electrically connected to the second active layer. The first gate electrode of the first thin-film transistor and the second gate electrode of the second thin-film transistor may be disposed on the second gate insulating layer.

The first active layer of the first thin-film transistor may be disposed on the buffer layer. The first gate insulating layer may be disposed on the first active layer and the buffer layer. The second active layer of the second thin-film transistor is disposed on the first gate insulating layer. The second gate insulating layer may be disposed on the second active layer and the first gate insulating layer. The first gate electrode of the first thin-film transistor and the second gate electrode of the second thin-film transistor may be disposed on the second gate insulating layer. An interlayer dielectric layer may be disposed over the first gate electrode, the second gate electrode and the second gate insulating layer. The first source electrode and the first drain electrode of the first thin-film transistor and the second source electrode and the second drain electrode of the second thin-film transistor may be disposed on the interlayer dielectric layer.

The first source electrode and the first drain electrode may be electrically connected to the first active layer through contact holes of the interlayer dielectric layer, the second gate insulating layer and the first gate insulating layer. The second source electrode and the second drain electrode may be electrically connected to the second active layer through contact holes of the interlayer dielectric layer and the second gate insulating layer.

The first active layer may comprise a first active region overlapping with the first gate electrode, a first source region in contact with the first source electrode, and a second drain region in contact with the first drain electrode. The second active layer may comprise a second active region overlapping with the second gate electrode, a second source region in contact with the second source electrode, and a second drain region in contact with the second drain electrode.

The first active region of the first active layer may overlap with the first gate electrode with the first gate insulating layer and the second gate insulating layer therebetween. The second active region of the second active layer may overlap with the second gate electrode with the second gate insulating layer therebetween.

The first gate electrode and the second gate electrode may be made of a same material.

According to another aspect of the present disclosure, a display device may include a first thin-film transistor including a first active layer, a first gate electrode, a first source electrode and a first drain electrode, and a second thin-film transistor including a second active layer, a second gate electrode, a second source electrodes and a second drain electrode. The display device may include a substrate; a buffer layer disposed on the substrate; the first active layer disposed on the buffer layer and made of a low-temperature poly-silicon (LTPS); a first gate insulating layer disposed on the first active layer and the buffer layer; the second active layer disposed on the first gate insulating layer and made of an oxide semiconductor; a second gate insulating layer disposed on the second active layer and the first gate insulating layer; the first gate electrode and the second gate electrode disposed on the second gate insulating layer; an interlayer dielectric layer disposed over the first gate electrode, the second gate electrode and the second gate insulating layer; and the first source electrode, the first drain electrode, the second source electrode and the second drain electrode disposed on the interlayer dielectric layer.

The first source electrode and the first drain electrode may be in contact with the first active layer through contact holes of the interlayer dielectric layer, the second gate insulating layer and the first gate insulating layer. The second source electrode and the second drain electrode may be in contact with the second active layer through contact holes of the interlayer dielectric layer and the second gate insulating layer.

The first gate electrode may overlap with the first active layer with the first gate insulating layer and the second gate insulating layer therebetween. The second gate electrode may overlap with the second active layer with the second gate insulating layer therebetween.

A lower surface of the first gate electrode and a lower surface of the second gate electrode may be in direct contact with an upper surface of the second gate insulating layer.

The first gate insulating layer may be disposed between an upper surface of the first active layer and a lower surface of the second active layer.

A lower surface of the second gate insulating layer may be in direct contact with an upper surface of the second active layer and an upper surface of the first gate insulating layer.

A lower surface of the first gate insulating layer may be in direct contact with an upper surface of the first active layer and an upper surface of the buffer layer.

The second gate insulating layer may be disposed between the upper surface of the second active layer and the lower surface of the second gate electrode. The first gate insulating layer and the second gate insulating layer may be disposed between the upper surface of the first active layer and the lower surface of the first gate electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a substrate;
   a buffer layer disposed on the substrate;
   a first thin-film transistor comprising:
      a first active layer made of a poly-silicon,
      a first part of a first gate insulating layer on the first active layer,
      a first part of a second gate insulating layer on the first part of the first gate insulating layer, and
      a first gate electrode overlapping with the first active layer on the first part of the second gate insulating layer; and
   a second thin-film transistor comprising:
      a second active layer made of oxide semiconductor,
      a second part of the second gate insulating layer on the second active layer, and
      a second gate electrode overlapping with the second active layer on the second part of the second gate insulating layer,
   wherein the second gate insulating layer is continuously formed on the first gate insulating layer so that the first part of the second gate insulating layer and the second part of the second gate insulating layer are formed integrally with each other,
   wherein the first gate electrode and the second gate electrode are in direct contact with the second gate insulating layer.

2. The display device of claim 1,
   wherein the second active layer of the second thin-film transistor is disposed on a second part of the first gate insulating layer.

3. The display device of claim 1, wherein the first gate electrode and the second gate electrode are made of a same material.

4. The display device of claim 1, further comprising:
   an interlayer dielectric layer disposed over the first gate electrode and the second gate electrode.

5. The display device of claim 4,
   wherein the first thin-film transistor further comprises a first source electrode and a first drain electrode electrically connected to the first active layer,
   wherein the second thin-film transistor further comprises a second source electrode and a second drain electrode electrically connected to the second active layer, and
   wherein at least a portion of the first source electrode and the first drain electrode of the first thin-film transistor and at least a portion of the second source electrode and the second drain electrode of the second thin-film transistor are disposed on the interlayer dielectric layer.

6. The display device of claim 4, wherein the first source electrode and the first drain electrode are electrically connected to the first active layer through one or more first contact holes in the interlayer dielectric layer, the second gate insulating layer, and the first gate insulating layer, and
   wherein the second source electrode and the second drain electrode are electrically connected to the second active layer through one or more second contact holes in the interlayer dielectric layer and the second gate insulating layer.

7. The display device of claim 4, further comprising:
   a storage capacitor comprising a first capacitor electrode and a second capacitor electrode on the first capacitor electrode,
   wherein the second capacitor electrode is disposed on the interlayer dielectric layer.

8. The display device of claim 7, wherein the second thin-film transistor further comprises a second source electrode and a second drain electrode electrically connected to the second active layer, and
   wherein the second capacitor electrode is connected to the second drain electrode.

9. The display device of claim 1, wherein the first part of the second gate insulating layer and the second part of the second gate insulating layer are connected to each other.

10. A display device comprising:
    a substrate;
    a buffer layer disposed on the substrate;
    a first active layer disposed on the buffer layer, the first active layer made of poly-silicon;
    a first gate insulating layer disposed on the first active layer and the buffer layer;
    a second active layer disposed on the substrate, the second active layer made of oxide semiconductor;
    a second gate insulating layer disposed on the second active layer and the first gate insulating layer;
    a first gate electrode on the second gate insulating layer, the first gate electrode overlapping the first active layer; and a second gate electrode on the second gate insulating layer, the second gate electrode overlapping the second active layer, wherein the second gate insulating layer is continuously formed on the first gate insulating layer so that a first part of the second gate insulating layer overlapping with the first gate electrode and a second part of the second gate insulating layer overlapping with the second gate electrode are formed integrally with each other, wherein the first gate electrode and the second gate electrode are in direct contact with the second gate insulating layer.

11. The display device of claim 10, wherein the second active layer is disposed on the first gate insulating layer.

12. The display device of claim 10, further comprising: an interlayer dielectric layer disposed over the first gate electrode, and the second gate electrode.

13. The display device of claim 12, further comprising: a first source electrode and a first drain electrode electrically connected to the first active layer;

a second source electrode and a second drain electrode electrically connected to the second active layer, wherein at least a portion of the first source electrode and the first drain electrode, and at least a portion of the second source electrode and the second drain electrode are disposed on the interlayer dielectric layer.

14. The display device of claim 12, wherein the first source electrode and the first drain electrode are in contact with the first active layer through one or more first contact holes in the interlayer dielectric layer, the second gate insulating layer, and the first gate insulating layer, and wherein the second source electrode and the second drain electrode are in contact with the second active layer through one or more second contact holes in the interlayer dielectric layer and the second gate insulating layer.

15. The display device of claim 12, further comprising:
a first capacitor electrode on the substrate; and
a second capacitor electrode on the interlayer dielectric layer.

16. The display device of claim 15, further comprising:
a source electrode and a drain electrode electrically connected to the second active layer, and
wherein the second capacitor electrode is connected to the drain electrode.

17. The display device of claim 15, wherein the first capacitor electrode is disposed on the second gate insulating layer.

18. The display device of claim 10, wherein a lower surface of the first gate electrode and a lower surface of the second gate electrode are in direct contact with an upper surface of the second gate insulating layer.

19. The display device of claim 10, wherein the first gate insulating layer is disposed between an upper surface of the first active layer and a lower surface of the second active layer.

* * * * *